(12) United States Patent
Wang

(10) Patent No.: US 7,851,141 B2
(45) Date of Patent: Dec. 14, 2010

(54) FLAT PANEL DISPLAY MANUFACTURING

(75) Inventor: Cheng-Chi Wang, Tainan (TW)

(73) Assignee: Chimei Innolux Corporation, Miao-Li County (TW)

( * ) Notice: Subject to any disclaimer, the term of this patent is extended or adjusted under 35 U.S.C. 154(b) by 772 days.

(21) Appl. No.: 11/681,325

(22) Filed: Mar. 2, 2007

(65) Prior Publication Data

US 2007/0275311 A1   Nov. 29, 2007

(30) Foreign Application Priority Data

Mar. 3, 2006   (TW) .............................. 95107305 A

(51) Int. Cl.
*G03F 7/20* (2006.01)
(52) U.S. Cl. ..................................... 430/394; 430/322
(58) Field of Classification Search ................. 430/311, 430/394
See application file for complete search history.

(56) References Cited

U.S. PATENT DOCUMENTS

| 6,187,486 | B1 | 2/2001 | Lai et al. |
| 2003/0198787 | A1 | 10/2003 | Kwan |
| 2005/0024549 | A1 | 2/2005 | Gotoh et al. |
| 2005/0213070 | A1* | 9/2005 | Scharnweber ................ 355/69 |
| 2008/0085471 | A1* | 4/2008 | Anderson et al. ........... 430/312 |

* cited by examiner

*Primary Examiner*—Kathleen Duda
(74) *Attorney, Agent, or Firm*—Fish & Richardson P.C.

(57) ABSTRACT

A method includes exposing a photo-resist layer using a first exposure machine that has a first resolution to cause the photo-resist layer to have an exposed portion and an un-exposed portion. The photo-resist layer is exposed using a second exposure machine that has a second resolution to further expose the un-exposed portion of the photo-resist layer, the first resolution being different from the second resolution.

21 Claims, 13 Drawing Sheets

FLAT PANEL DISPLAY MANUFACTURING

CROSS-REFERENCE TO RELATED APPLICATIONS

This application claims priority to Taiwan application serial no. 095107305, filed Mar. 3, 2006, the contents of which are incorporated by reference.

BACKGROUND OF THE INVENTION

The description relates to manufacture of flat panel displays.

An example of a flat panel display is a liquid crystal display that includes an array of pixels each including a thin film transistor, a storage capacitor, a liquid crystal cell, and transparent pixel electrodes. Scan lines and data lines are provided to enable individual control of the pixels. The thin film transistors, storage capacitors, pixel electrodes, scan lines, and data lines can be fabricated on a glass substrate using a photolithography process.

SUMMARY

In one aspect, in general, a method includes exposing a photo-resist layer using a first exposure machine that has a first resolution to cause the photo-resist layer to have an exposed portion and an un-exposed portion, and exposing the photo-resist layer using a second exposure machine that has a second resolution to further expose the unexposed portion of the photo-resist layer, the first resolution being different from the second resolution.

Implementations of the method may include one or more of the following features. The second resolution is higher than the first resolution. The first exposure machine processes a larger area of the photo-resist layer per unit of time than the second exposure machine. The first exposure machine is configured to define lines having widths not smaller than 5 µm, and the second exposure machine is configured to define lines having widths smaller than 5 µm. The method includes developing the photo-resist layer after exposing the photo-resist layer using the first exposure machine to cause the photo-resist layer to have a first pattern that includes an alignment mark. The method includes developing the photo-resist layer after exposing the photo-resist layer using the second exposure machine to cause the developed photo-resist layer to have a second pattern. The method includes etching a layer of material using the photo-resist layer having the second pattern as an etching mask. The first exposure machine can be, e.g., a proximity exposure machine. The second exposure machine can be, e.g., a scanner exposure machine, a stepper exposure machine, or a beam writing machine. The method includes fabricating a component of a flat panel display using the exposed photo-resist layer as an etching mask.

In another aspect, in general, a method includes processing a photo-resist layer using a first photo-mask and a first exposure machine to cause the photo-resist layer to have an exposed portion and an un-exposed portion, the un-exposed portion having a first pattern, and processing the photo-resist layer using a second exposure machine to further expose the photo-resist layer to cause the un-exposed portion to have a second pattern. Features of the first pattern have a first minimum dimension, and features of the second pattern have a second minimum dimension that is different from the first minimum dimension.

Implementations of the method may include one or more of the following features. The second minimum dimension is smaller than the first minimum dimension. The method includes developing the photo-resist layer to remove the exposed portion of the photo-resist layer. The method includes developing the photo-resist layer and etching a metal layer using a remaining portion of the photo-resist layer as an etching mask to form electrodes of a transistor. The first pattern defines widths of the electrodes, and a spacing in the second pattern defines a spacing between a first one of the electrodes and a second one of the electrodes. The first exposure machine can be, e.g., a proximity exposure machine. The second exposure machine can be, e.g., a scanner exposure machine, a proximity exposure machine, or a beam writing machine.

In another aspect, in general, a lithography system includes a first exposure machine having a first resolution, a second exposure machine having a second resolution that is different from the first resolution, a transport module to transport a substrate between the first and second exposure machines, and a controller. The controller controls the first exposure machine to process a photo-resist layer on the substrate, controls the transport module to transport the substrate from the first exposure machine to the second exposure machine, and controls the second exposure machine to further process the same photo-resist layer.

Implementations of the system may include one or more of the following features. The first exposure machine includes a proximity exposure machine. The second exposure machine includes a scanner exposure machine, a proximity exposure machine, or a beam writing machine.

In another aspect, in general, a photo-mask set includes a first photo-mask having a first pattern that has a first resolution, and a second photo-mask having a second pattern that has a second resolution different from the first resolution. The first photo-mask is used to define a first pattern on a photo-resist layer, the second photo-mask is used to define a second pattern on the same photo-resist layer, and the first and second patterns form a third pattern on the photo-resist layer that is used to define a geometry of another layer of material.

Implementations of the photomask set may include one or more of the following features. The second resolution is higher than the first resolution. The first pattern has a line width greater than 5 µm. The second pattern has a line width less than or equal to 5 µm. The first photo-mask includes a transparent portion that is associated with a portion of the photo-resist layer to be removed.

In another aspect, in general, a method includes using a first exposure machine to define a first geometric feature of a photo-resist layer on a substrate of a display, the first geometric feature being associated with a width of a metal data line of the display, and using a second exposure machine to define a second geometric feature of the same photo-resist layer, the second geometric feature being associated with a spacing between a source electrode and a drain electrode of a transistor of the display.

In another aspect, in general, a method of manufacturing a display includes defining larger-dimension patterns of a photoresist layer using a first photomask and a proximity exposure machine, and defining smaller-dimension patterns of the same photoresist layer using a second photomask and a stepper exposure machine.

Implementations of the method may include one or more of the following features. The first photomask includes patterns for defining connecting lines at a peripheral region of the display. The first photomask has a size that covers an entire substrate of the display. The second photomask includes patterns for defining channel lengths of transistors of the display.

Advantages of the apparatuses and methods may include one or more of the following. The total amount of time required for exposing a photoresist layer for defining the patterns of a layer of material (e.g., a metal layer) of a flat panel display can be reduced. The number of photomasks for defining the patterns of the entire layer of material (e.g., a metal layer) can be reduced. The costs associated with expensive, high precision exposure machines can be reduced.

DETAILED DESCRIPTION

Figure 1:
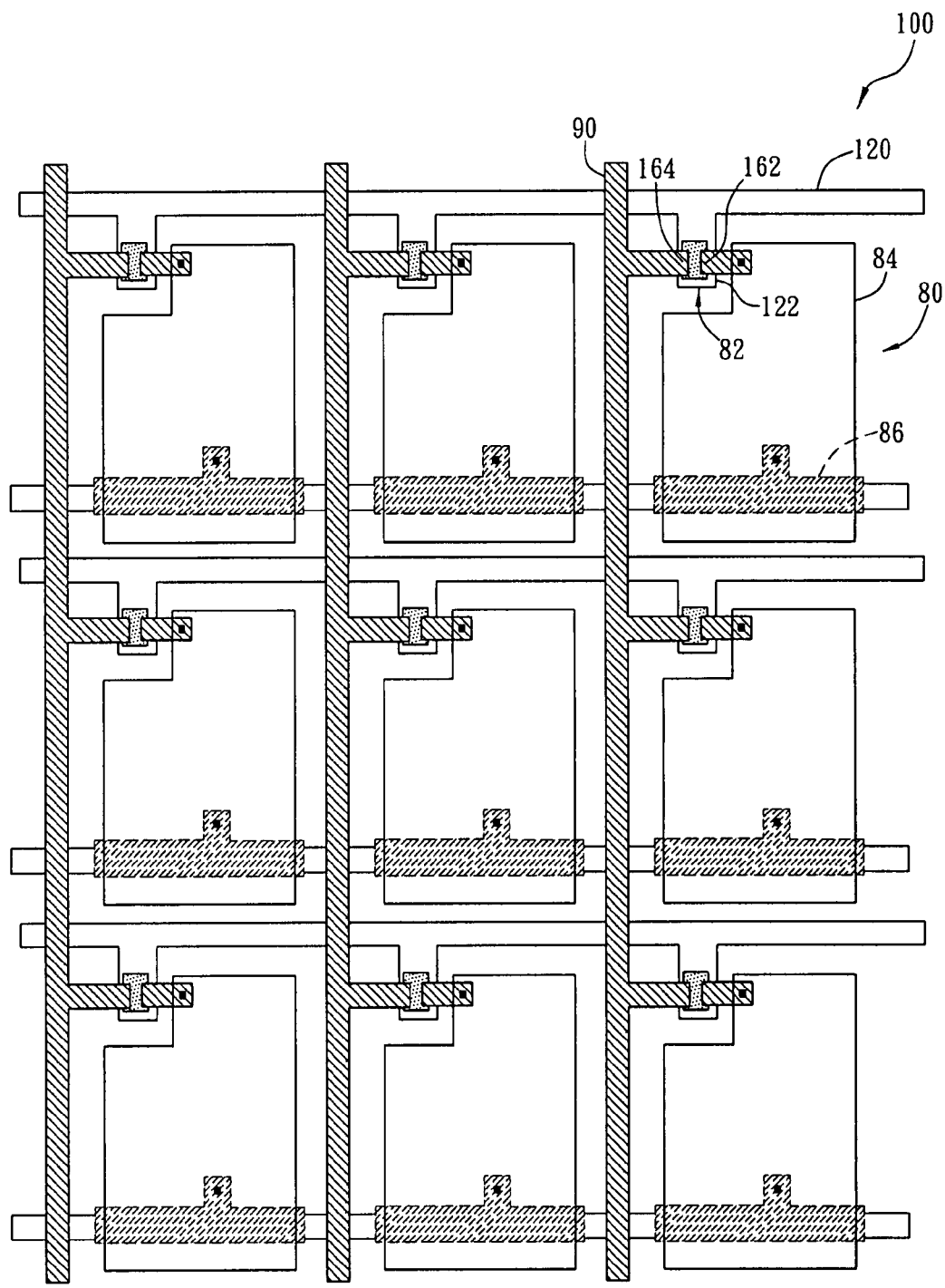
FIG. 1 is a schematic diagram of an array of pixels.

FIG. 1 is a schematic diagram of an example of an array of pixels 80 of a flat panel display 100. Components of the pixels 80 can be fabricated using a photolithography process. For example, a photoresist layer can be used as an etching mask for etching a metal layer to form data lines 90 and transistor electrodes 162, 164. The patterns on the photoresist layer can be defined by exposing a portion of the photoresist, developing the photoresist, and removing the exposed portion of the photoresist (if a positive-type photoresist material is used), leaving the un-exposed portion as the etching mask. Some patterns may have larger dimensions and can be defined using a larger area, lower-resolution exposure machine, while other patterns may have smaller dimensions and can be defined using a smaller area, higher resolution exposure machine. By using different exposure machines to expose the same layer of photoresist to define patterns having large and small dimensions, the total amount of time required to expose a large area photoresist layer can be reduced, and the costs associated with expensive precision exposure machines can be reduced.

In some examples, each pixel 80 includes a thin film transistor (TFT) 82, a pixel electrode 84, a common electrode (not shown), a liquid crystal cell (not shown) between the pixel electrode 84 and the common electrode, and a storage capacitor having a plate electrode 86. The TFT 82 has a gate electrode 122 that is electrically connected to a gate line 120, a drain electrode 164 that is electrically connected to a data line 90, and a source electrode 162 that is electrically connected to the pixel electrode 84 and the plate electrode 86 of the storage capacitor.

In some examples, during operation of the display 100, the common electrode is connected to a ground reference voltage. A scan signal is applied to the gate line 120 to turn on the TFT 82, and a pixel voltage representing a specified gray scale level is sent through the data line 90 to the pixel electrode 84 and the plate electrode 86, generating an electric field in the liquid crystal cell between the pixel electrode 84 and the common electrode. The electric field affects an optical phase retardation of the liquid crystal cell and changes the transmittance or reflectance of the pixel 80, enabling the pixel 80 to show the specified gray scale level.

Some components of the pixels 80 can be fabricated using a multi-step photolithography process. For example, a metal layer can be etched to form the data line 90, the drain electrode 164, the source electrode 162, and the plate electrode 86. In some of the lithography steps, a photoresist layer is used as an etching mask for etching a layer of material, such as a layer of metal, silicon nitride, or poly-silicon. A layer of photoresist is first formed on the layer of material to be etched. An exposure process exposes the photoresist layer to a pattern of light to cause the photoresist layer to have an exposed portion and an un-exposed portion defined by the pattern of light. When a positive-type photoresist material is used, the exposed portion of the photoresist becomes more soluble to a photoresist developer. After developing the photoresist, the exposed portion is washed away, leaving the un-exposed portion, which is used as the etching mask for etching the layer of material beneath the photoresist layer.

Several methods can be used to expose the photoresist material. For example, when a proximity exposure machine is used, a photomask having a specific pattern is placed in proximity to a substrate having the photoresist layer to be exposed. A gap of about, e.g., 10 to 25 microns is maintained between the photomask and the photoresist layer to reduce mask damage. The pattern on the photomask is transferred to the photoresist by projecting light through the photomask onto the photoresist layer. The pattern is transferred from the photomask to the photoresist layer according to a 1:1 size ratio. In some examples, the proximity exposure machine can have a maximum resolution of about, e.g., 5 microns, meaning that the proximity exposure machine can accurately define lines having a minimum width of 5 microns on the photoresist.

For example, when a stepper exposure machine is used, an image of a photomask pattern is projected onto a photoresist layer through a projection lens system. The projected image on the photoresist layer can be of a same size or of a smaller size than the pattern on the photomask. The stepper exposure machine is more accurate than the proximity exposure machine and can be used to define patterns having smaller dimensions on the photoresist layer. The projected patterns extends over a portion of the photoresist layer, and the stepper exposure machine steps through different areas of the photoresist layer so that the entire area of the photoresist layer is processed after multiple exposures.

In some examples, a 1300 mm by 1100 mm glass substrate is used to fabricate 42-inch display panels. When a proximity exposure machine is used to expose the photoresist layer on the glass substrate, a photomask that covers the entire glass substrate is used so the entire photoresist layer is exposed in one exposure. The exposure can take about, e.g., 1 to 2 seconds. By comparison, when a stepper exposure machine is used, each exposure exposes, e.g., ¼ to ⅙ of the photoresist layer on the glass substrate so that 4 to 6 exposures are used to expose the entire photoresist layer. Each exposure can take about, e.g., 5 to 6 seconds, so the total time period for exposing the entire photoresist layer takes about 20 to 36 seconds. When forming smaller patterns on the photoresist layer, the exposure time is longer so that the edges of the patterns are better defined.

For example, a beam writing machine can be used in which, e.g., a laser beam, an electron beam, or an ion beam is used to write patterns on the photoresist layer. The amount of time required for writing a pattern on the photoresist layer depends on the size of the pattern—the larger the pattern, the longer the writing time.

Figure 2:
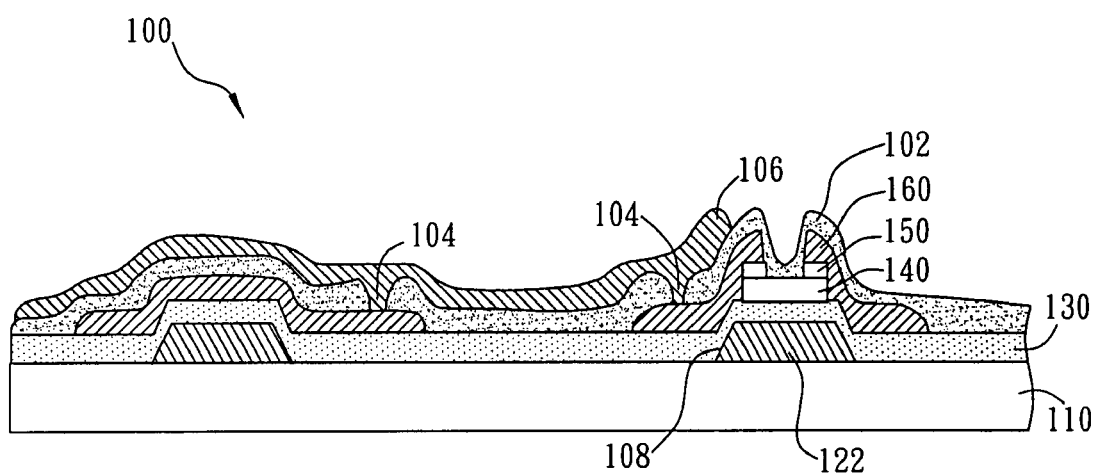
FIG. 2 is a cross-sectional diagram of a portion of a display.

FIG. 2 is a cross-sectional diagram of a portion of the display 100. During fabrication of the display 100, a first metal layer 108 (metal 1) is deposited on a glass substrate 110 and etched to form gate lines 120 (FIG. 1) and gate electrodes 122. A silicon nitride (SiNx) layer 130 is formed above the first metal layer 108. An amorphous silicon layer 140 and a doped n+ amorphous silicon layer 150 are deposited and etched to form islands above the silicon nitride layer 130. The island of amorphous silicon 140 represents a channel of the transistor 82. A second metal layer 160 (metal 2) is deposited and etched to form the data lines 90, the source electrode 162, the drain electrode 164, and the plate electrode 86 (FIG. 1). A passivation layer 102 is deposited and etched to form vias 104. An indium-tin-oxide (ITO) layer 106 is deposited and etched to form the pixel electrode 84, in which the ITO material fills in the vias 104 and contacts the source electrode 162 and the plate electrode 86.

Figure 3:
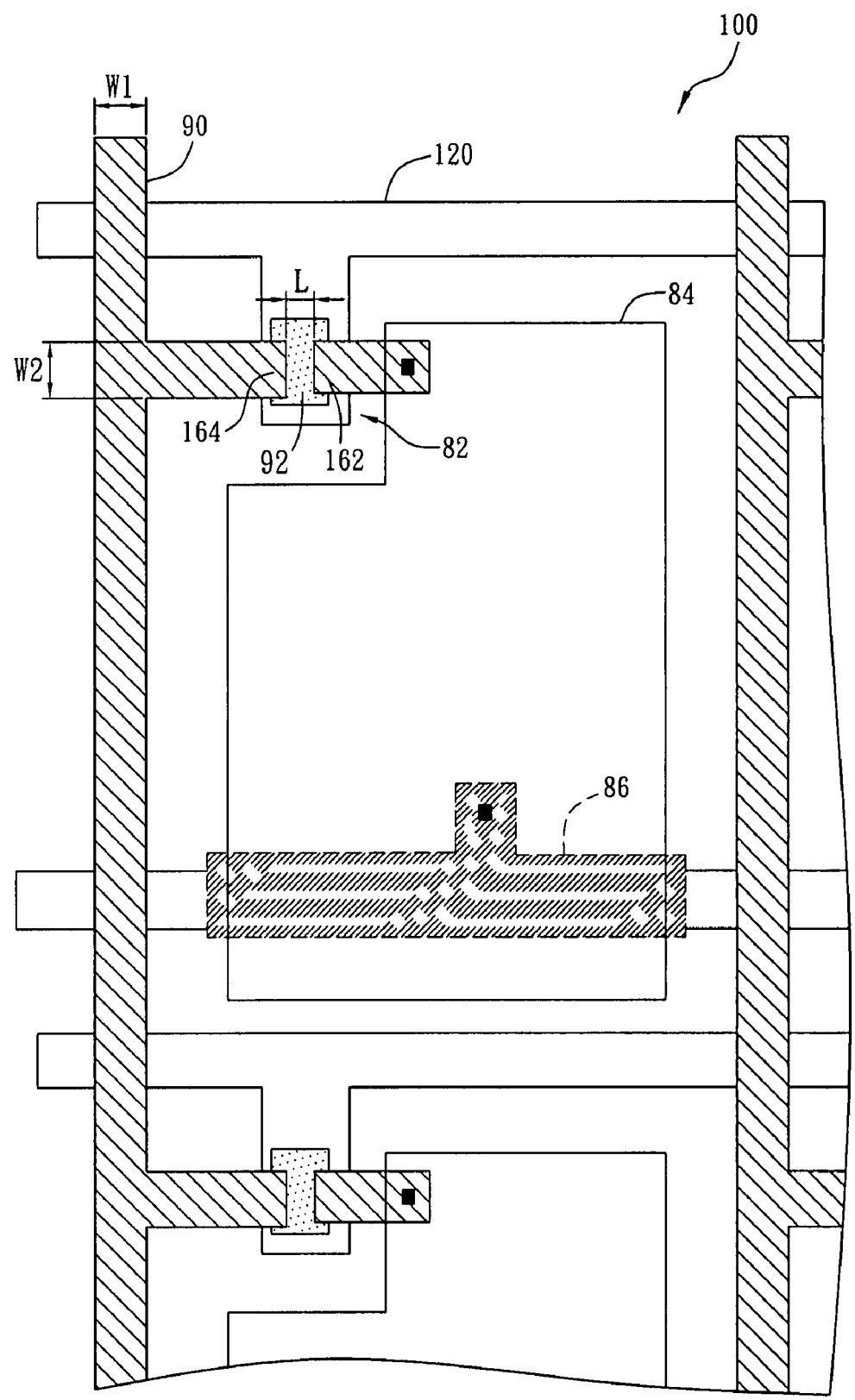
FIG. 3 a schematic diagram of pixels.

Referring to FIG. 3, as described above, the data line 90, the drain electrode 164, and the source electrode 162 can be fabricated using the second metal layer 160 (FIG. 2). The source electrode 162 and drain electrode 164 are spaced apart by a gap 92 having a width L, which corresponds to the channel length of the transistor 82. The width L can be, e.g., 3 μm. Other than the gap 92, the patterns on the second metal layer 160 have dimensions greater than 5 μm. For example, the width w1 of the data line 90 is about 6 μm, and the width w2 of the electrodes 162 and 164 is about 10 μm.

When exposing a photoresist layer 170 (FIG. 4B) to be used as an etching mask for etching the second metal layer 160, some of the patterns on the photoresist layer 170 will have dimensions greater than 5 μm, and some of the patterns will have dimensions equal to or smaller than 5 μm. In some examples, two exposure processes are used to expose the photoresist layer. In the first exposure process, a larger area, lower resolution exposure machine, such as a proximity exposure machine, exposes the photoresist layer to cause the photoresist layer to have a first pattern having dimensions greater than 5 μm. For example, the first exposure process defines the geometry of the data line 90, the plate electrode 86, and the drain and source electrodes 162 and 164 connected together without the gap 92.

In the second exposure process, higher resolution exposure machine, such as a stepper exposure machine, a scanner exposure machine, or a beam writing machine, is used to expose a pattern on the photoresist layer 170 that defines the gap 92. After the two exposure processes, the photoresist layer is developed and the unexposed portion is washed away (when positive-type photoresist is used). The remaining un-exposed portion of the photoresist layer is used as the etching mask for etching the second metal layer 160 to form the data lines 90, the plate electrodes 86, the drain electrodes 164, and the source electrodes 162, with the gaps 92 precisely defined.

The following describes an example of processing steps for fabricating array of the pixels 80.

Figure 4A:
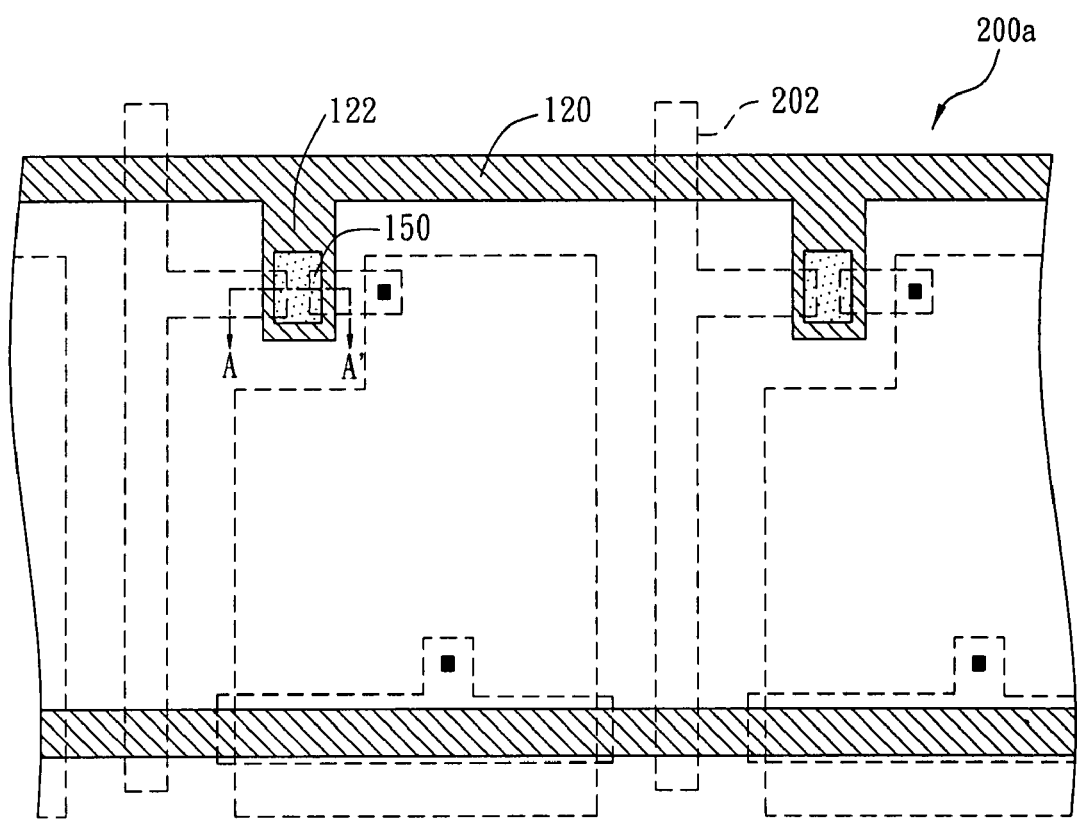
FIG. 4A is a schematic diagram of a partially fabricated TFT array.

FIG. 4A is a schematic diagram showing a portion of a partially fabricated TFT array 200a. Here, a number of components have been fabricated, including gate lines 120, gate electrodes 122, amorphous silicon channels 140, and n+ amorphous silicon layers 150. The dashed lines 202 represent components that have not been fabricated.

Figure 4B:
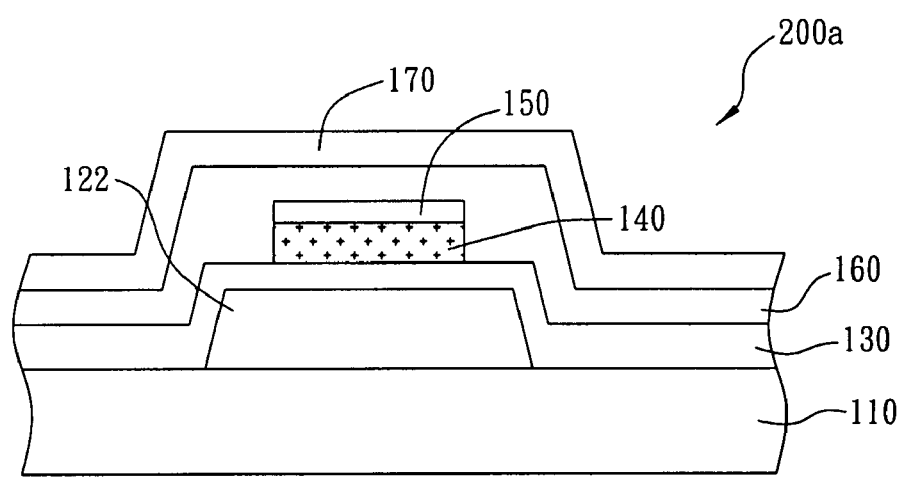
FIG. 4B is a cross-sectional diagram of the partially fabricated TFT array of FIG. 4A.

FIG. 4B is a cross-sectional diagram of the partially fabricated TFT array 200a along an A-A' line. A gate electrode 122 is formed on a glass substrate 110. A silicon nitride (SiNx) insulating layer 130 is formed on the gate electrode 122 and on the glass substrate 110. An amorphous silicon (α-Si) channel 140 is formed on the insulating layer 130. An n+ amorphous silicon layer 150 is formed on the amorphous silicon channel 140. A metal layer 160 is formed above the n+ amorphous silicon layer 150 and the insulating layer 130. Prior to etching, the metal layer 160 is a continuous, unpatterned layer. A photoresist layer 170 is deposited above the metal layer 160. Prior to exposure and development, the photoresist layer 170 is a continues, unpatterned layer. In this example, the photoresist layer 170 uses a positive-type photoresist.

Figure 5A:
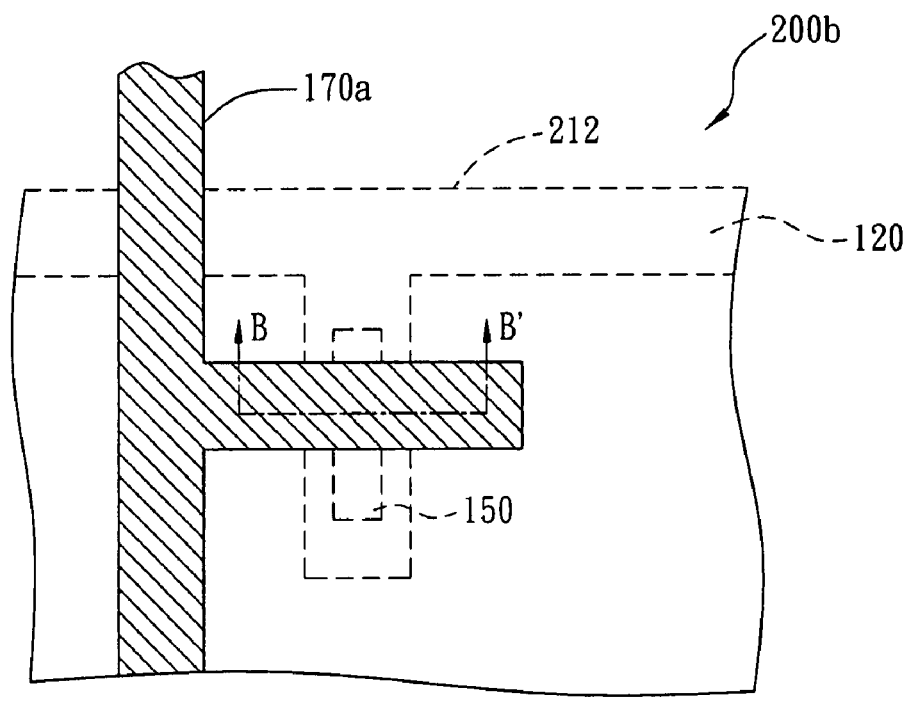
FIG. 5A is a schematic diagram of a partially fabricated TFT array.

FIG. 5A is a schematic diagram showing a portion of the partially fabricated TFT array 200b, in which the photoresist layer 170 has been subject to a first exposure process. The photoresist layer 170 includes un-exposed portions 170a (indicated as shaded regions) having a first pattern. The exposed portion can be developed and washed away. The exposed portion can also remain above the second metal layer 160 while the photoresist layer 170 undergoes a second exposure process described below. The dashed lines 212 represent components that are below the second metal layer 160.

Figure 5B:
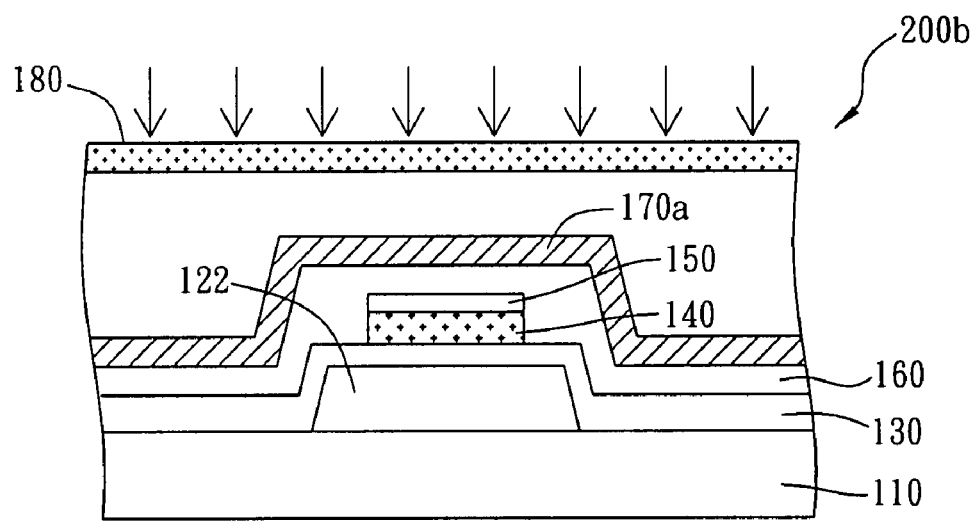
FIG. 5B is a cross-sectional diagram of the partially fabricated TFT array of FIG. 5A.

FIG. 5B is a cross-sectional diagram of the partially fabricated TFT array 200b along a B-B' line. In the first exposure process, a first photomask 180 is used to define the first pattern of the un-exposed portions 170a of the photoresist layer 170. The first exposure process can be implemented using a low-resolution, large-area exposure machine, such as a proximity exposure machine.

Figure 5C:
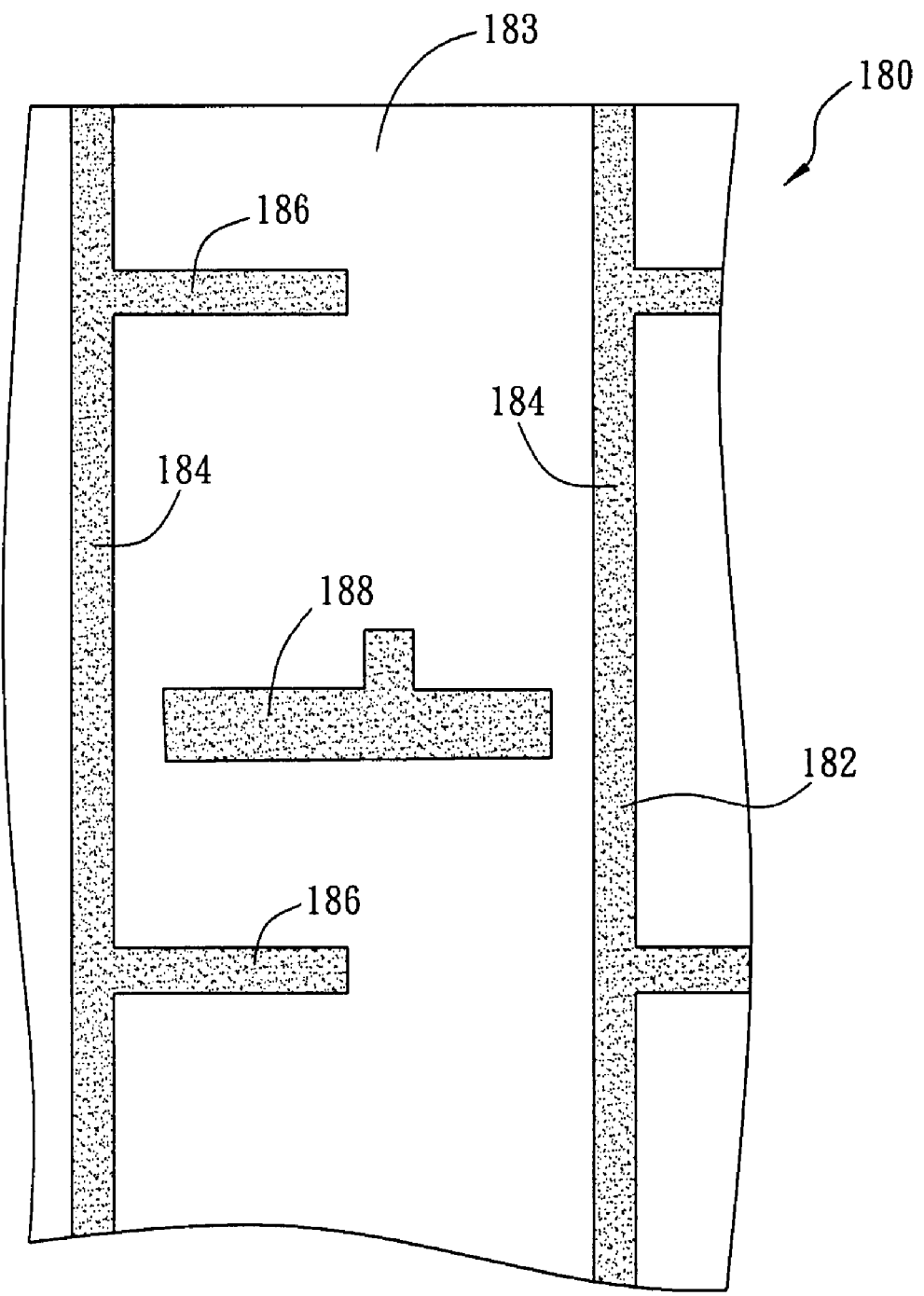
FIG. 5C is a diagram of a photomask.

FIG. 5C is a diagram of the first photomask 180, which includes opaque areas 182 and transparent areas 183. The opaque areas correspond to the un-exposed portions 170a. The opaque areas 182 include areas 184 that correspond to the data lines 90, areas 186 that correspond to the transistor electrodes 162 and 164 connected together without the gap 82, and areas 188 that correspond to the plate electrodes 86. The first photomask 180 has patterns having dimensions greater than, e.g., 5 μm. The first photomask 180 can have a size comparable to the glass substrate 110 so that the entire photoresist layer can be exposed in one exposure.

The patterns on the photomask 180 refer to the patterns of the opaque areas 182. The dimensions of the patterns may refer to dimensions of the opaque areas 182 and dimensions of the spacing between the opaque areas 182. In some examples, the opaque areas 182 are defined by multiple opaque lines, and the transparent areas 183 are defined by multiple transparent lines. The opaque and transparent lines on the photomask has a minimum width that corresponds to the maximum resolution of the exposure machine. For example, if the exposure machine has a maximum resolution of 5 μm, then the minimum line width of the opaque and transparent lines is also set to 5 um. In the case where the pattern on the photomask is formed by opaque and transparent lines, the minimum dimension of the photomask pattern refers to the minimum line width of the opaque and transparent lines.

In some examples, the opaque areas 182 can include alignment marks. After the first exposure process, the photoresist layer 170 is developed and the exposed portion is removed.

The patterned photoresist layer 170 includes alignment marks that can be used to align a photomask in a subsequent exposure process.

Figure 6A:
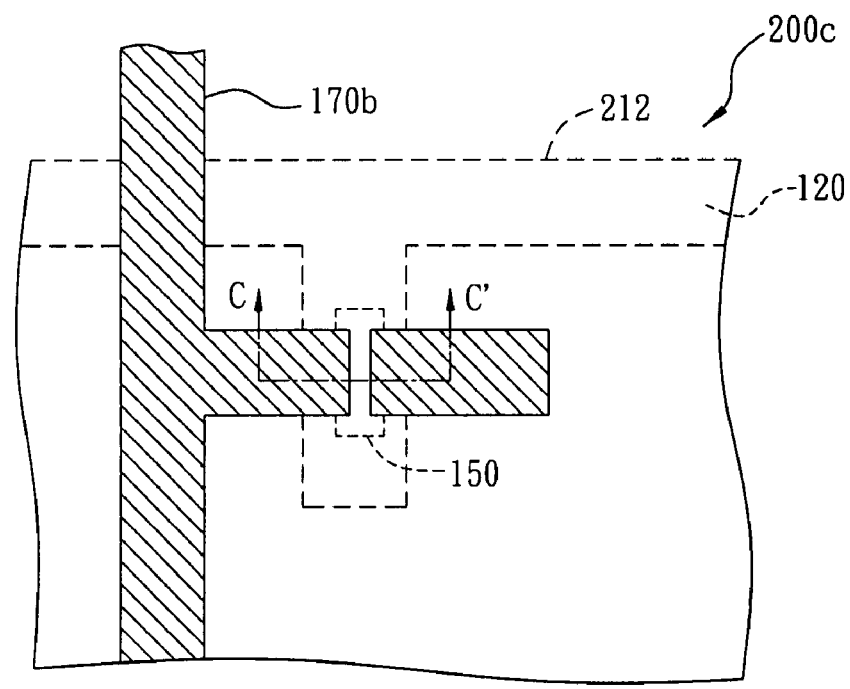
FIG. 6A is a schematic diagram of a partially fabricated TFT array.

FIG. 6A is a schematic diagram showing a portion of the partially fabricated TFT array 200c, in which the photoresist layer 170 has been subject to a second exposure process. The photoresist layer 170 includes un-exposed portions 170b (indicated as shaded regions) having a second pattern. The exposed portion can be developed and washed away.

Figure 6B:
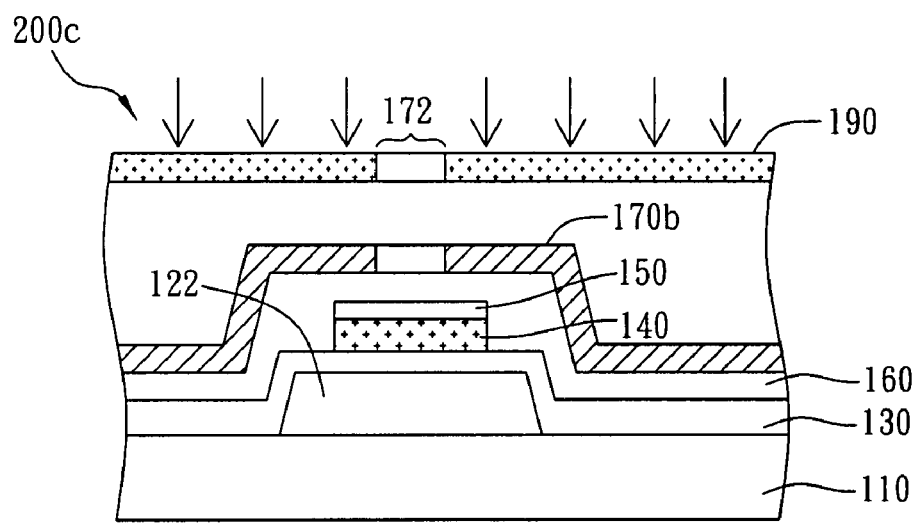
FIGS. 6B to 6C are cross-sectional diagrams of a partially fabricated TFT array.

FIG. 6B is a cross-sectional diagram of the partially fabricated TFT array 200c along a C-C' line. In the second exposure process, a second photomask 190 is used to further expose portions of the un-exposed portions 170a, resulting in the un-exposed portions 170b. The un-exposed portions 170b has a second pattern that corresponds to the intended pattern on the second metal layer 160. The second photomask 190 has patterns with dimensions equal to or less than, e.g., 5 μm.

The second exposure process can be implemented using a higher resolution exposure machine, such as a scanner exposure machine or a stepper exposure machine, to transfer the pattern on the photomask 190 to the photoresist layer 170. The exposed photoresist is developed and removed to form the patterned photoresist layer 170b.

Figure 6C:
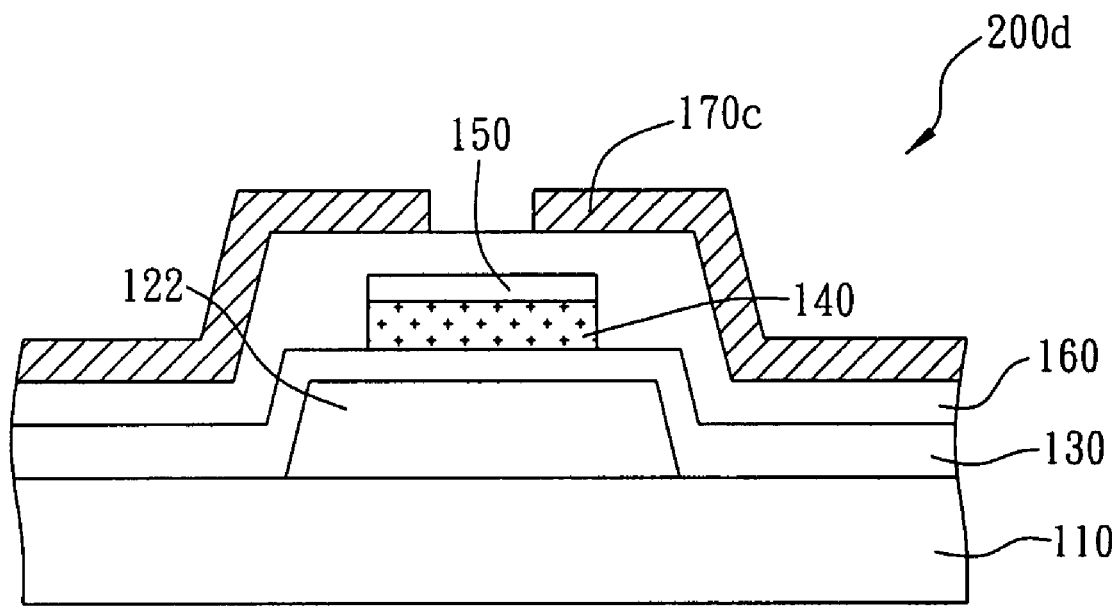

FIG. 6C is a cross-sectional diagram of the partially fabricated TFT array 200d in which the exposed portion of the photoresist layer 170 is removed, resulting in a photo-resist layer 170c having a complete pattern for use as an etching mask for etching the second metal layer 160.

Figure 6D:
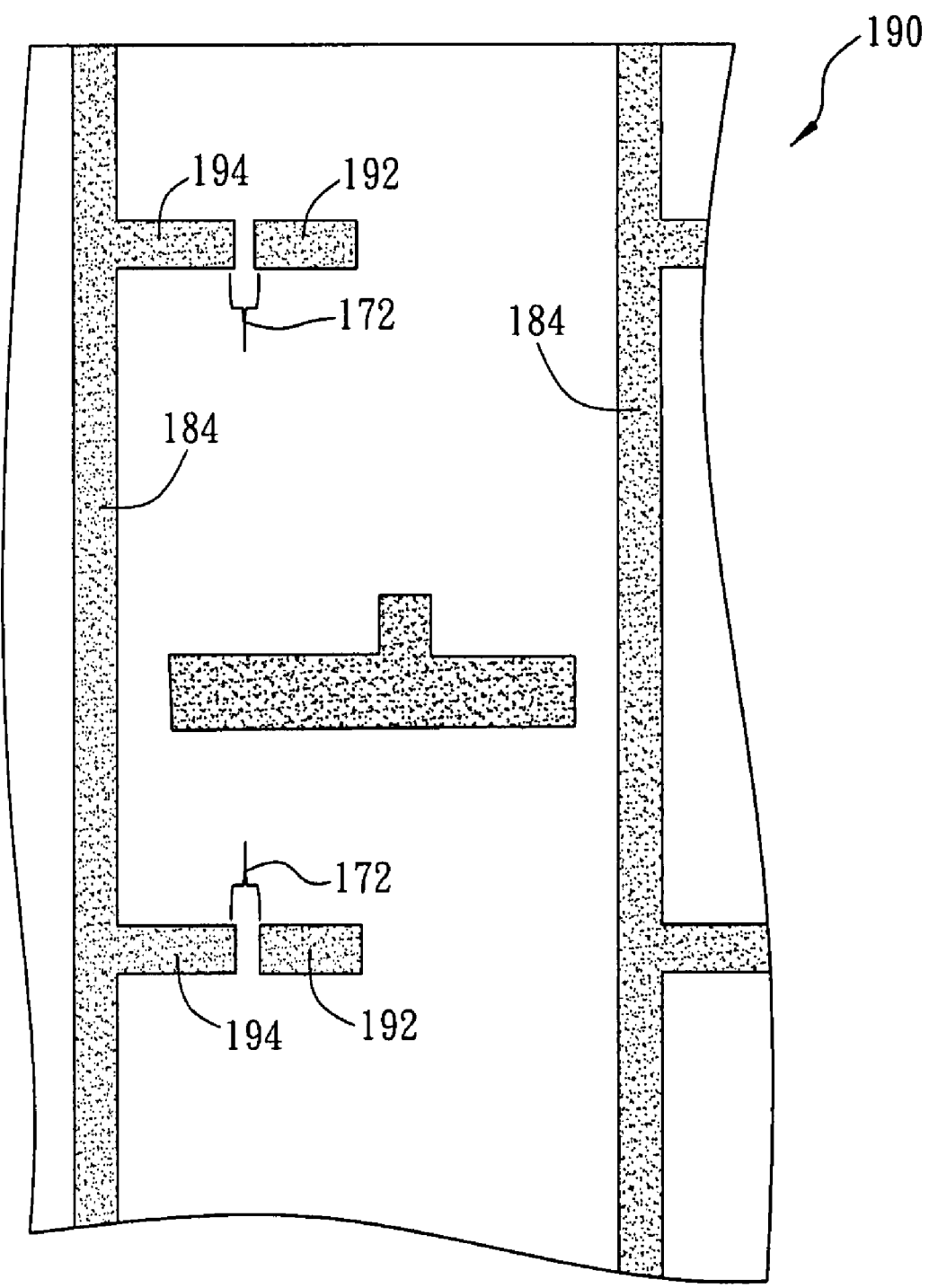
FIG. 6D is a diagram of a photomask.

FIG. 6D is a diagram of the second photomask 190, showing opaque areas 184 that correspond to the data lines 90, areas 188 that correspond to the plate electrodes 86, areas 192 that correspond to the source electrodes 162, and areas 194 that correspond to the drain electrodes 164. Gaps 172 between the areas 192 and 194 correspond to the gaps 82 between the electrodes 162 and 164. The second photomask 190 has patterns having minimum dimensions equal to or less than, e.g., 5 μm. In this example, the width of the gap 172 is equal to or less than 5 μm.

The photomask 190 can have a size that is smaller than the substrate 110 so that multiple exposures are used to expose the entire photoresist layer 170.

Figure 7:
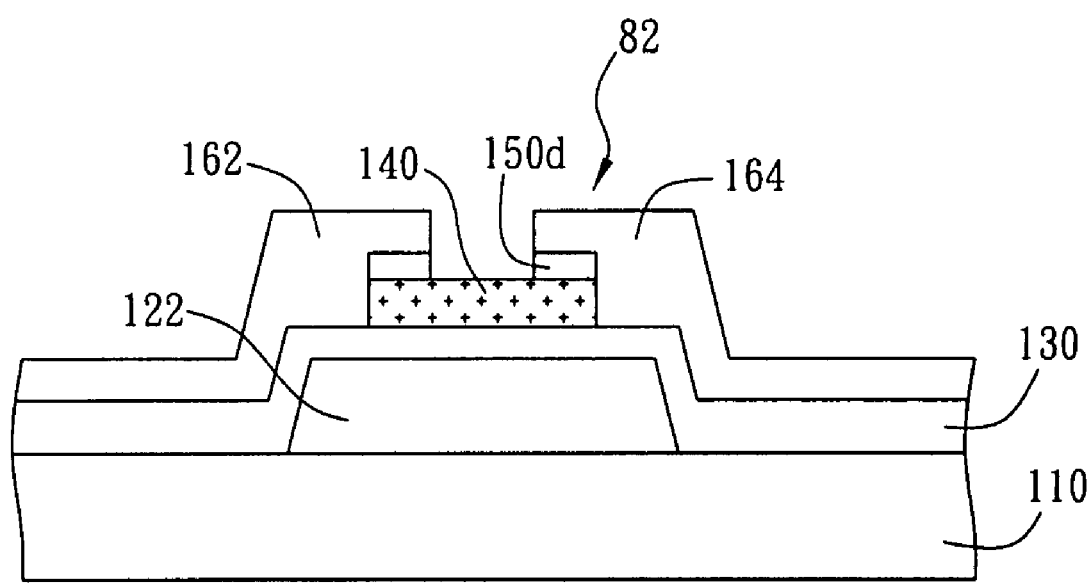
FIG. 7 is a cross-sectional diagrams of a partially fabricated TFT array.

Referring to FIG. 7, the photoresist layer 170c (FIG. 6C) that is formed after exposing and developing is used as an etching mask for etching the second metal layer 160. The n+ amorphous silicon layer 150 and the metal layer 160 are etched to form an n+ amorphous silicon layer 150d, a source electrode 162, and a drain electrode 164. Removing the photo-resist layer 170c completes the process for fabricating the source and drain electrodes 162, 164 of the TFT 82.

The exposure method for manufacturing a flat panel display described above first defines a low-resolution pattern using a low-resolution exposure machine, then defines a high-resolution pattern using a high-resolution exposure machine, on the same photoresist layer. Because the exposure area of the high-resolution pattern is smaller than that of the low-resolution pattern, this method can reduce the processing time, as compared to using the high-resolution exposure machine only to define all the patterns. Moreover, using the low-resolution exposure machine to perform some of the exposure tasks can reduce usage of the high-resolution exposure machine, which can be more expensive.

In some examples, the high-resolution pattern can be defined directly on the photoresist layer using a laser beam, an electron beam, an ion beam, or a beam in cooperation with a high-resolution photomask. By using the low-resolution exposure machine to define the low-resolution patterns, the beam writing machine is used for a shorter period of time to define a smaller area on the photoresist, reducing cost associated with the more expensive beam writing machine.

Figure 8:
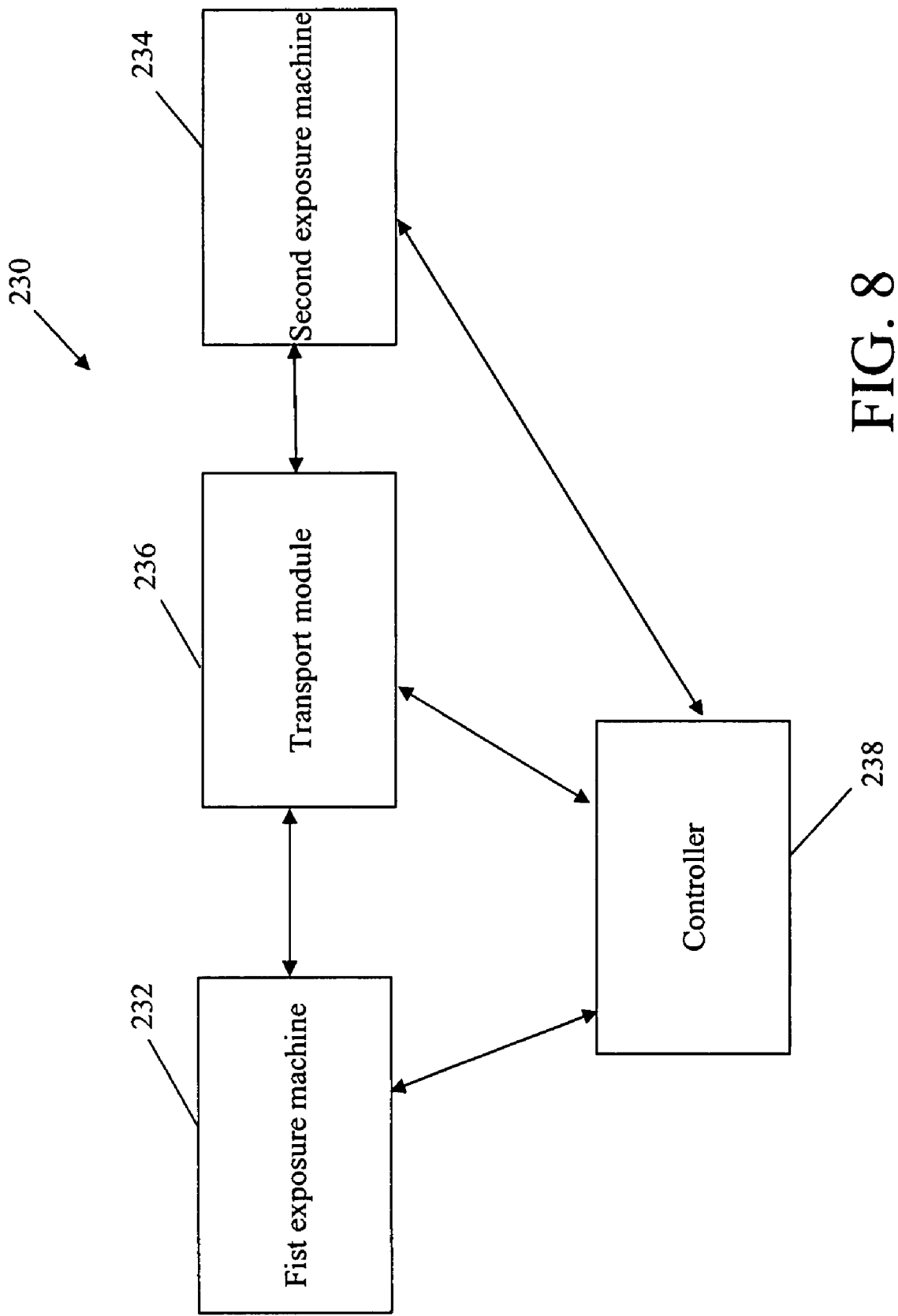
FIG. 8 is a block diagram of a photolithography system.

FIG. 8 is a block diagram of an example of a photolithography system 230 for fabricating a flat panel display. The system 230 includes a first exposure machine 232, a second exposure machine 234, and a transport module 236 that are controlled by a controller 238. The first exposure machine 232 can be a low-resolution, large-area exposure machine, such as a proximity exposure machine. The second exposure machine 234 can be a high-resolution exposure machine, such as a scanner exposure machine, a stepper exposure machine, or a beam writing machine. The transport module 236 transfers partially processed substrates between the first and second exposure machines 232 and 234. The system 230 may include other modules not shown in the figure.

To implement the exposure process shown in 4A to 6D, the controller 238 controls the first exposure machine 232 to expose the photoresist layer 170 using the first photomask 180. After the first exposure process is complete, the controller 238 controls the transport module 236 to transfer the substrate 110 from the first exposure machine 232 to the second exposure machine 234. The controller 238 controls the second exposure machine 234 to expose the photoresist layer 170 using the second photomask 190. After the second exposure process is complete, the controller 238 controls the transport module 236 to transfer the substrate 110 from the second exposure machine 232 back to the first exposure machine 234 to perform the remaining exposure processes.

A lithography system that uses a larger area, lower resolution exposure machine in combination with a smaller area, higher resolution exposure machine is useful in fabricating a large size device that has a layer of material having a combination of large-dimension patterns and small-dimension patterns.

Figure 9A:
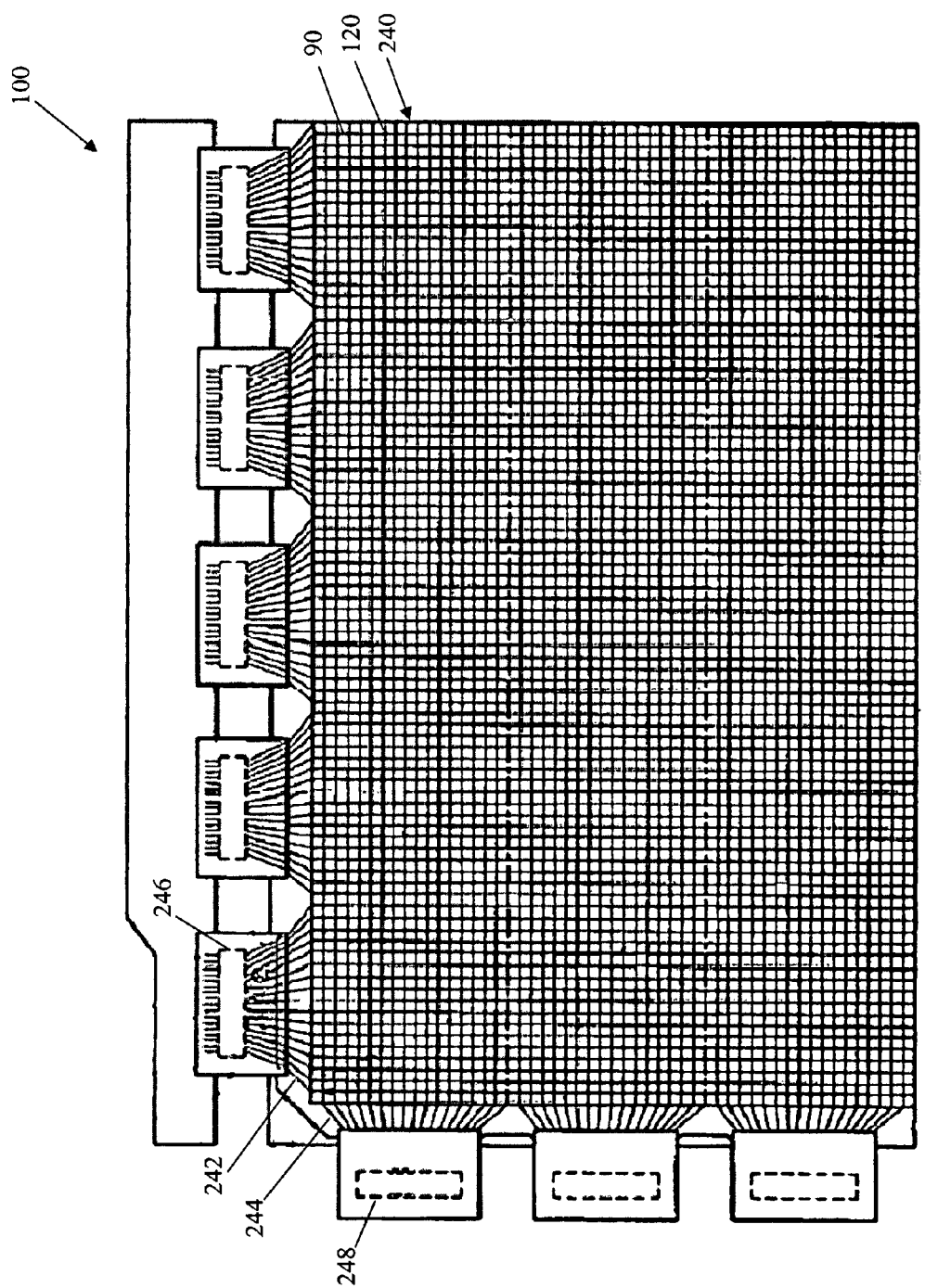
FIG. 9A is a diagram of a layout design of a display.

FIG. 9A is a diagram showing an example of a layout design 240 for patterned metal layers of the display 100. The metal layers form, e.g., the gate lines 120, data lines 90, transistor electrodes, capacitor plate electrodes, connecting lines 242 for connecting the data lines 90 to data drivers 246, and connecting lines 244 for connecting the gate lines 120 to gate drivers 248. The layout design 240 includes the layout of the first metal layer 108 and the second metal layer 160.

As described above, the gap 92 between the drain electrode 164 and the source electrode 162 of the transistor 80 has a small dimension. The resolution of a proximity exposure machine may not be high enough to accurately define the gap 92. A stepper exposure machine can be used to define the gap 92 by using a sophisticated projection lens system to accurately project fine patterns of a photomask onto a photoresist layer. The images projected by the stepper exposure machine has a finite size, so if the size of the display 100 is larger than the size of images projected by the stepper exposure machine, the stepper exposure machine has to step through different portions of the display and expose a portion of the photoresist layer at a time.

Figure 9B:
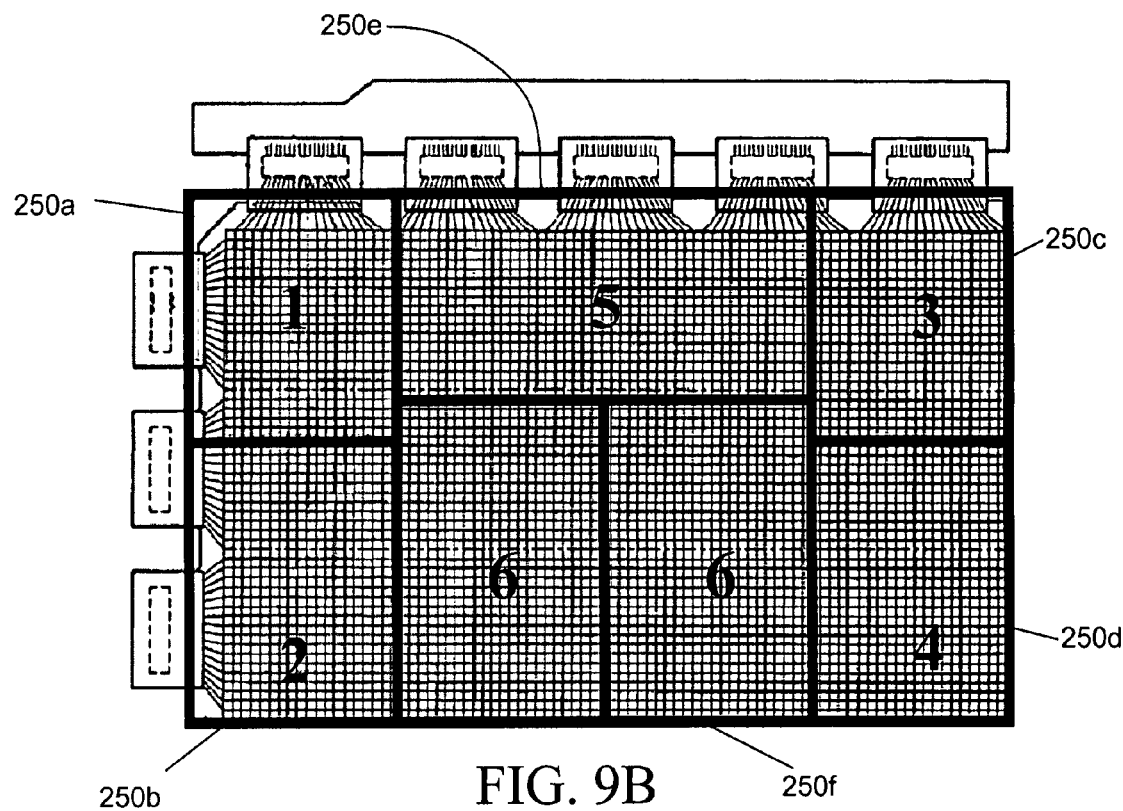
FIG. 9B is a diagram of a layout design of a display and a set of photomasks.

The layout design 240 includes the layout patterns for a pixel array, and the layout patterns for a peripheral portion that includes connecting lines 242, 244 for connecting to, e.g., source drivers and gate drivers. Referring to FIG. 9B, when a stepper exposure machine is used to expose the entire photoresist layer, because the patterns are not entirely repetitive (e.g., the patterns of the pixel array are different from the patterns at the peripheral portion), different photomasks are used to define the layout patterns for different portions of the display 100. In this example, a photomask set of six different photomasks 250a to 250f are used. The sixth photomask 250f can be used multiple times to expose multiple regions because they have the same pixel circuit layout patterns. When a stepper exposure machine is used, the photomasks need to be changed five times to expose the entire photoresist layer.

Figure 9C:
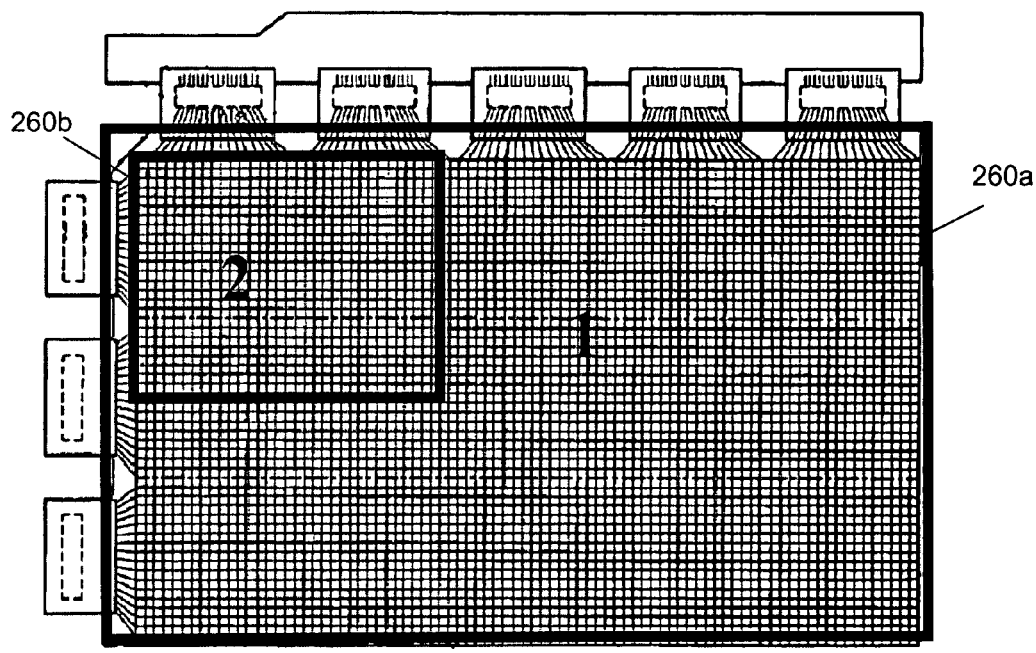
FIG. 9C is a diagram of a layout design of a display and a set of photomasks.

Referring to FIG. 9C, because the layout patterns in the peripheral portion (which includes the connecting lines 242 and 244) have larger dimensions, they can be defined by using a proximity exposure machine. Thus, a large photomask 260a that covers the entire glass substrate of the display 100 can be used with a proximity exposure machine to define the patterns having larger dimensions (including patterns for gate lines 120, data lines 90, connecting lines 242 and 244) in one exposure. Next, a photomask 260b can be used with a stepper exposure machine to define the patterns having smaller dimensions (e.g., gaps 92) in the pixel array. The stepper exposure machine steps through different locations to define the patterns for the pixel array. Because the patterns for the pixel array are repetitive, a single photomask 260b can be used to define the smaller-dimension patterns for the entire pixel array. This way, two photomasks (one larger and one smaller) can be used to define a metal layer (e.g., metal layer 160) of the display 100. Because the number of photomasks is reduced, the amount of time required for loading and unloading photomasks is reduced, and the total amount of time required to complete the exposure process is shortened.

Although some examples have been discussed above, other implementations and applications are also within the scope of the following claims. For example, flat panel displays other than liquid crystal displays can be fabricated using the exposure process described above. Partially processed substrates can be manually transferred between two exposure machines. In the second exposure process of FIGS. 6A to 6C, instead of using a second photomask 190, a beam writing machine can be used to expose the photoresist layer 170a by writing directly on the photoresist layer using a focused beam. For example, the beam writing machine can write a line that corresponds to the gap 82 between the source and drain electrodes 162 and 164. Instead of using a stepper exposure machine, a scanner exposure machine can be used, in which a light beam scans a photomask to transfer patterns on the photomask to a photoresist layer. The configurations of photomasks can be different from those shown in FIGS. 9B and 9A. The combination of two exposure machines can be used to define patterns on layers of materials other than those described above. Additional steps may be used in the exposure processes described above. For example, after a photoresist layer is developed and the exposed portion is washed away (when positive-type photoresist is used), the un-exposed photoresist may be hardened through a baking process.

Using two exposure machines to process the same photo-resist layer is not limited to fabrication of flat panel displays. This can also be used in fabricating other devices, such as large scale semiconductor chips or systems.

What is claimed is:

1. A method comprising:
    exposing a photo-resist layer using a first photomask and a first exposure machine that has a first resolution to cause the photo-resist layer to have an exposed portion and an un-exposed portion, the first photomask having a first pattern; and
    exposing the photo-resist layer using a second photomask and a second exposure machine that has a second resolution to further expose the un-exposed portion of the photo-resist layer, the first resolution being different from the second resolution, the second photomask having a second pattern, the second pattern being a subset of the first pattern.

2. The method of claim 1 wherein the second resolution is higher than the first resolution.

3. The method of claim 1 wherein exposing the photo-resist layer using the first exposure machine comprises using the first exposure machine to process a larger area of the photo-resist layer per unit of time than using the second exposure machine to process the photo-resist layer.

4. The method of claim 1 wherein the first exposure machine is configured to define lines having widths not smaller than 5 μm, and the second exposure machine is configured to define lines having widths smaller than 5 μm.

5. The method of claim 1, further comprising developing the photo-resist layer after exposing the photo-resist layer using the first exposure machine to cause the photo-resist layer to have a first pattern comprising an alignment mark.

6. The method of claim 5, further comprising developing the photo-resist layer after exposing the photo-resist layer using the second exposure machine to cause the developed photo-resist layer to have a second pattern.

7. The method of claim 1 in which the first exposure machine comprises a proximity exposure machine.

8. The method of claim 1 in which the second exposure machine comprises at least one of a scanner exposure machine, a stepper exposure machine, and a beam writing machine.

9. The method of claim 1 in which all of opaque regions of the second photomask correspond to a subset of opaque regions of the first photomask.

10. The method of claim 9 in which the second photomask has a transparent region that corresponds to an opaque region in the first photomask, and a width of the transparent region corresponds to a channel length of a transistor that is fabricated using the first and second photomasks.

11. A method comprising:
    processing a photo-resist layer using a first photo-mask and a first exposure machine to cause the photo-resist layer to have an exposed portion and an un-exposed portion, the un-exposed portion having a first pattern; and
    processing the photo-resist layer using a second photomask and a second exposure machine to further expose the photo-resist layer to cause the un-exposed portion to have a second pattern, in which features of the first pattern have a first minimum dimension, features of the second pattern have a second minimum dimension that is different from the first minimum dimension; and the second photomask has a pattern that is a subset of the pattern of the first photomask.

12. The method of claim 11, wherein the second minimum dimension is smaller than the first minimum dimension.

13. The method of claim 11, further comprising developing the photo-resist layer and etching a metal layer using a remaining portion of the photo-resist layer as an etching mask to form electrodes of a transistor.

14. The method of claim 13 in which the first pattern defines widths of the electrodes, and a spacing in the second pattern defines a spacing between a first one of the electrodes and a second one of the electrodes.

15. The method of claim 11 in which using the first exposure machine comprises using a proximity exposure machine.

16. The method of claim 11 in which using the second exposure machine comprises using at least one of a scanner exposure machine, a proximity exposure machine, and a beam writing machine.

17. The method of claim 11 in which all of opaque regions of the second photomask correspond to a subset of opaque regions of the first photomask.

18. The method of claim 17 in which the second photomask has a transparent region that corresponds to an opaque region in the first photomask, and a width of the transparent region corresponds to a channel length of a transistor that is fabricated using the first and second photomasks.

19. A method comprising:
using a first exposure machine and a first photomask to define a first geometric feature of a photo-resist layer on a substrate of a display, the first geometric feature being associated with a width of a metal data line of the display, the first photomask having a first pattern; and
using a second exposure machine and a second photomask to define a second geometric feature of the same photo-resist layer, the second geometric feature being associated with a spacing between a source electrode and a drain electrode of a transistor of the display, the second photomask having a second pattern, the second pattern being a subset of the first pattern.

20. The method of claim 19 in which all of opaque regions of the second photomask correspond to a subset of opaque regions of the first photomask.

21. The method of claim 20 in which the second photomask has a transparent region that corresponds to an opaque region in the first photomask, and a width of the transparent region corresponds to the spacing between the source and drain electrodes.

* * * * *